United States Patent
Fan et al.

(10) Patent No.: US 6,512,242 B1
(45) Date of Patent: Jan. 28, 2003

(54) RESONANT-TUNNELING ELECTRONIC TRANSPORTORS

(75) Inventors: Shanhui Fan, Somerville, MA (US); Pierre R. Villeneuve, Boston, MA (US); John D. Joannopoulos, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/228,147

(22) Filed: Jan. 11, 1999

Related U.S. Application Data (60) Provisional application No. 60/071,253, filed on Jan. 12, 1998.

(51) Int. Cl.[7] ............ H01L 29/06; H01L 31/0328

(52) U.S. Cl. ................ 257/14; 257/25; 257/24

(58) Field of Search .................. 257/24, 25, 20, 257/14

(56) References Cited

U.S. PATENT DOCUMENTS

| 5,350,931 A | * | 9/1994 | Harvey et al. |
| H1570 H | * | 8/1996 | Lux et al. |
| 5,640,022 A | * | 6/1997 | Inai |
| 5,804,475 A | * | 9/1998 | Meyer |
| 6,103,583 A | * | 8/2000 | Morimoto et al. |
| 6,139,483 A | * | 10/2000 | Seabaugh et al. |

* cited by examiner

*Primary Examiner*—Stephen D. Meier
(74) *Attorney, Agent, or Firm*—Samuels, Gauthier & Stevens, LLP (57) ABSTRACT

An electronic transportor that allows for the resonant tunneling of electrons between guided states, such as those found in a quantum wire or a line defect in a solid, and localized states, such as those found in a quantum dot or a point defect in a solid, using lateral coupling. In some embodiments, the transporter allows electrons of different energies to be transported to different ports of associated waveguides. In other embodiments, the transportor allows electrons of different energies to be transported at different phases.

34 Claims, 10 Drawing Sheets

RESONANT-TUNNELING ELECTRONIC TRANSPORTORS

PRIORITY INFORMATION

This application claims priority from provisional application Ser. No. 60/071,253 filed Jan. 12, 1998.

This invention was made with government support under Grant Number 9400334-DMR awarded by the National Science Foundation. The government has certain rights in the invention.

BACKGROUND OF THE INVENTION

The invention relates to resonant-tunneling electronic transporters using lateral coupling between guided and localized states.

A striking analogy exists between electromagnetic waveguiding in dielectric materials and electronic waveguiding in semiconductor nanostructures. While electromagnetic (EM) waves can travel inside a dielectric waveguide such as an optical fiber, electrons (or electronic wavefunctions) can propagate inside an electronic waveguide such as a quantum wire. For reference, see Eugstar et al., "Tunneling spectroscopy of an electron waveguide", Physical Review Letters, vol. 67, pp. 3586–89 (1991). It has been demonstrated recently that EM waves can selectively be transferred from one dielectric waveguide to another by using a resonant coupling element between the two waveguides. Similar effects can be achieved in the electronic device as well.

Progress in nanofabrication technology has allowed electronic devices to be fabricated with a size on the order of 10 nanometers. For reference, see S. Datta, Electronic Transport in Mesoscopic Systems, Cambridge University Press, Cambridge, U.K., 1995). As the size of the device becomes smaller, the quantum mechanical nature of electrons becomes important. In other words, in these devices, electrons behave as a wave, rather than as a classical particle.

Due to the wave nature of the electrons, devices such as electronic waveguides, and electronic resonators, have been constructed and demonstrated. Using these waveguides and resonators, a variety of devices have been fabricated and tested. One example is a waveguide coupler, which directly side-couples two waveguides together to transfer electrons from one waveguide to the other. See, Eugster, et al, "One-dimensional to one-dimensional tunneling between electron waveguides", Applied Physics Letters, vol. 64, p. 3157 (1994). Another example is to use the electronic resonator as a narrow-band transmission filter, which selectively transmit electrons through the resonator at the resonant energy, while suppressing the transmission of electrons at other energies. See, Goldhaber-Gordon et al., "Kondo effect in a single-electron transistor", Nature, vol. 391, pp. 156–159 (1998).

SUMMARY OF THE INVENTION

An object of the present invention is to show that electrons can be transferred between electronic waveguides or between different ports of the same waveguide via a resonant coupling element. The invention provides an electronic device which allows for electrons of different energies to be transported to different ports. The invention relies on the use of a resonant coupling element, such as an arrangement of quantum dots, positioned between two electronic waveguides. Two such types of electronic transport devices (or transporters) are presented. The first type has two ports, while the second type has four ports.

Accordingly, the invention provides an electronic transportor that allows for the resonant tunneling of electrons between guided states, such as those found in a quantum wire or a line defect in a solid, and localized states, such as those found in a quantum dot or a point defect in a solid, using lateral coupling. In some embodiments, the transporter allows electrons of different energies to be transported to different ports of associated waveguides. In other embodiments, the transporter allows electrons of different energies to be transported at different phases.

These and other objects, features and advantages of the present invention will become apparent in light of the following detailed description of preferred embodiments thereof, as illustrated in the accompanying drawings.

DETAILED DESCRIPTION OF THE INVENTION

Figure 1:
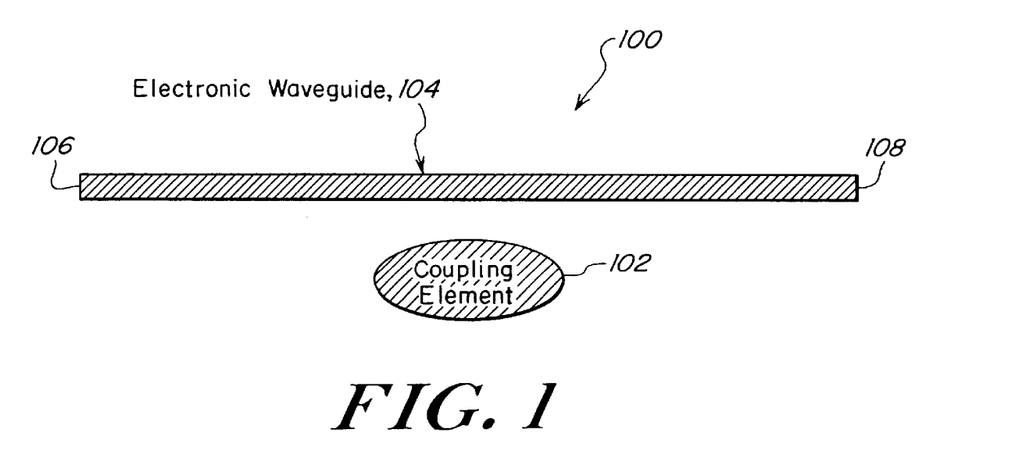
FIG. 1 is a simplified schematic diagram of a 2-port electronic transporter using a single coupling element.

FIG. 1 is a simplified schematic diagram of a 2-port electronic transporter 100 using a single resonant coupling element 102. An example of a resonant coupling element is an electronic resonator as described by R. C. Ashoori, "Electrons in artificial atoms", Nature, vol. 379, pp. 413–9 (1996), incorporated herein by reference. An electronic waveguide 104 is positioned in close proximity to the resonant coupling element. An example of an electronic waveguide can be found in Eugster et al.,. "Tunneling Spectroscopy of an Electron Waveguide", Physical Review Letters, volume 67, pp. 3586–89 (1991), incorporated herein by reference. The extended electronic wavefunctions (the electrons) inside the waveguide are laterally coupled to the localized electronic states inside the coupling element by resonant tunneling. Electrons originating from an input port 106 travel down the waveguide 104 and, at resonance, tunnel out of the waveguide and into the coupling element 102. The resonant state (or states) then decays into the waveguide along both the backward and forward directions.

The wavefunction at the input port is composed only of the decaying wavefunction from the coupling element. The transmitted wavefunction at an output port 108 is composed of two parts: the input wavefunction and the signal which originates from the decay of the electronic wavefunction (or wavefunctions) in the coupling element. These signals interfere with one another. The overall properties of the device depend on the number of resonant states inside the coupling element, and on their energies and lifetimes. In the illustrated embodiments, the electronic waveguides consist of quantum wires, and the coupling elements consist of one or more quantum dots, each of which is able to support one or more localized electronic state. It will be appreciated that other embodiments can include the use of a line defect in a solid as an electronic waveguide, and a point defect in a solid as a coupling element.

Figure 2A:
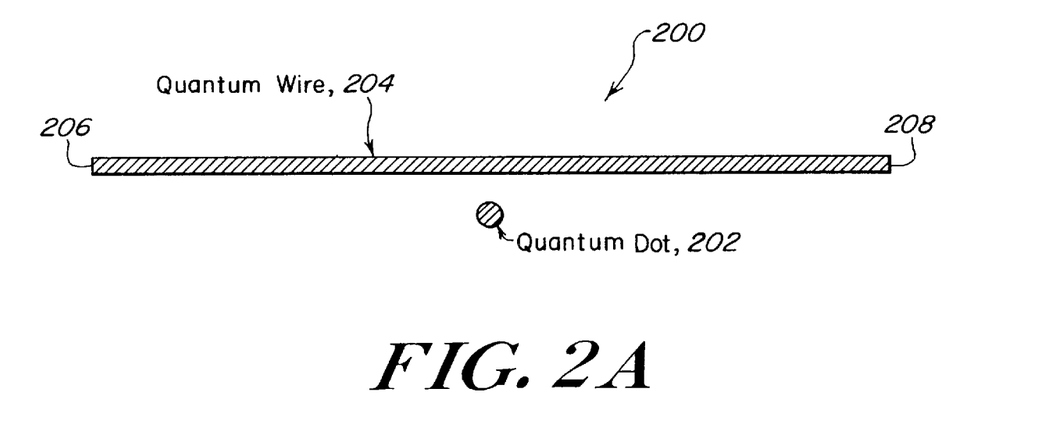
FIG. 2A is a simplified schematic diagram of an electronic transporter using a single quantum wire and a single quantum dot.

In a first exemplary embodiment, a single quantum dot is located near a quantum wire, as shown in FIG. 2A. FIG. 2A is a simplified schematic diagram of an electronic transporter 200 of the invention. The transporter includes a single quantum wire 204 and a single quantum dot 202. The quantum dot is designed to support a single resonant state at the energy of interest. In this case, the input wavefunction and the signal which originates from the decay of the localized state inside the quantum dot cancel, leading to zero transmission. At resonance, all the electrons originating from an input port 206 are reflected back. Only the electrons off resonance are transported to an output port 208.

Figure 2B:
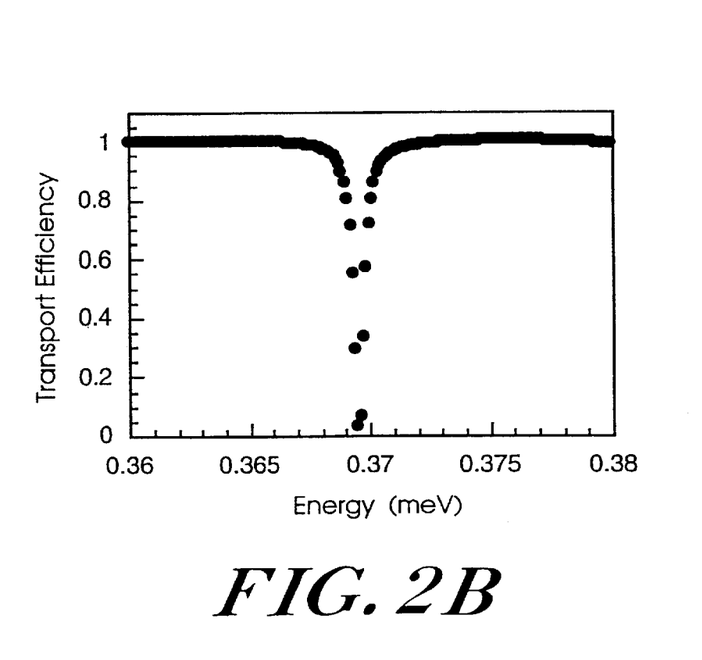
FIG. 2B is a graph plotting transport efficiency vs. electronic energy.

FIG. 2B is a graph of the transport efficiency vs. electronic energy for the transportor 200. The transport efficiency from the input port 206 to the output port 208 is plotted as a function of the electron energy. The device prevents electrons at resonance from reaching the output port, while allowing electrons off resonance to reach the output. Thus, the transportor behaves as a narrow-band reflector.

Figure 3A:
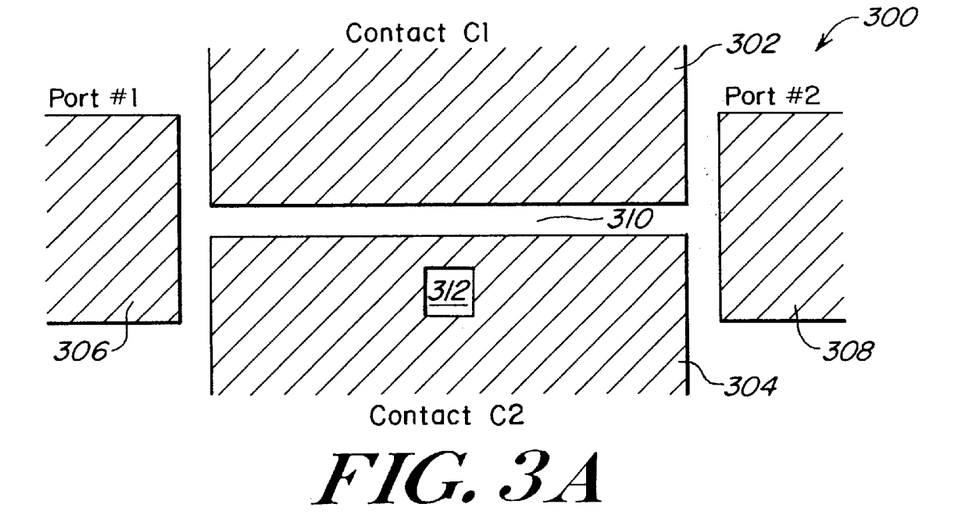
FIG. 3A is a top view of an electronic transporter fabricated in a standard AlGaAs/GaAs heterostructure.
Figure 3B:
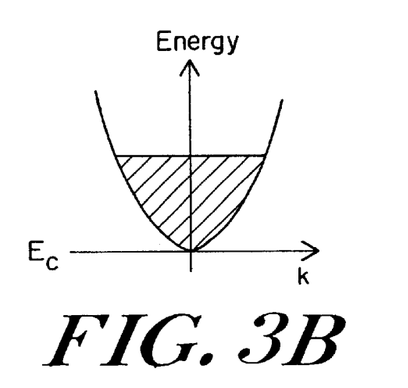
FIGS. 3B, 3C, 3D, 3E are graphs of conductance between an input port and an output port vs. applied voltage.
Figure 3C:
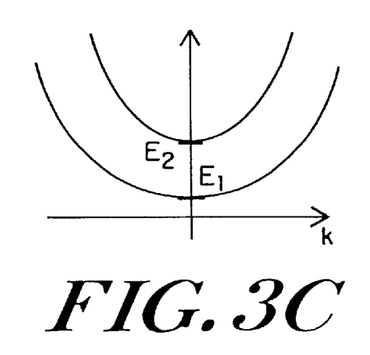
Figure 3D:
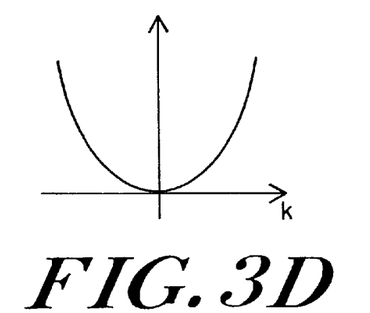
Figure 3E:
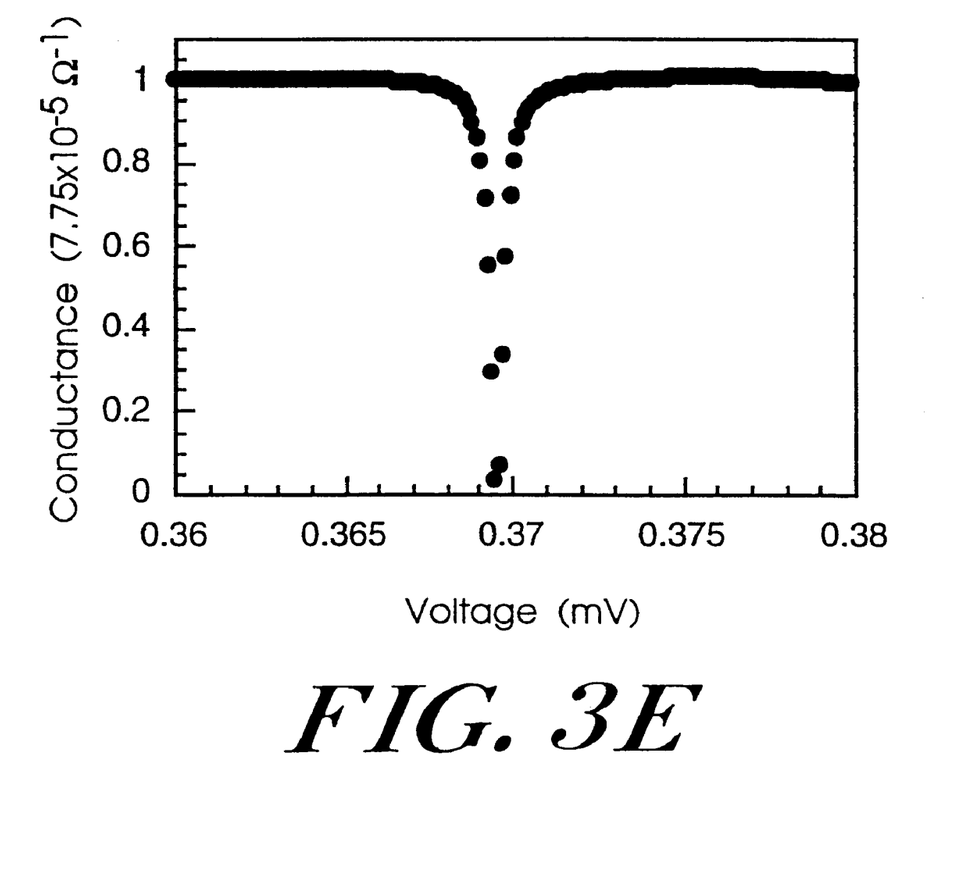

The illustrated embodiment described above can be fabricated in a standard AlGaAs/GaAs heterostructure, as described in S. Datta, *Electronic transport in mesoscopic systems*, Cambridge University Press, Cambridge, U.K. (1995), incorporated herein by reference. FIG. 3A is a top view of an electronic transportor 300 fabricated in a standard AlGaAs/GaAs heterostructure. The transportor 300 includes a first metal contact 302, a second metal contact 304, an input port 306 and an output port 308. The shaded regions indicate the location of the metal contacts. The configuration of the metal contacts defines an electronic waveguide 310 and an electronic resonator 312. FIGS. 3B–3D are graphs of the electronic dispersion relations inside input port 306, inside the electronic waveguide, and inside the output port 308, respectively. FIG. 3D is a graph plotting the conductance between input port 306 and output port 308 vs. applied voltage.

A bias voltage is applied across input port 306 and output port 308 to generate free electrons in the input port while leaving the conduction band in the output port empty. The energy at the conduction band edge is labeled Ec. Two bands are shown in the dispersion relation of the quantum wire. The bands have energies $E_1$ and $E_2$ at k=0, where k is the electronic wavevector. $E_1$ and $E_2$ are approximated by:

$$E_1 = \frac{\hbar^2}{2m} \cdot \left(\frac{\pi}{a}\right)^2 \quad (1)$$

$$E_2 = \frac{\hbar^2}{2m} \cdot \left(\frac{2\pi}{a}\right)^2 = 4 \cdot E_1 \quad (2)$$

where m* is the effective mass of the electron, and a is the width of the quantum wire. $E_1$ and $E_2$ are measured from the conduction band edge Ec.

In the case where the quantum wire has a width of 170 nm and an effective electron mass 0.066 times that of the electron (which corresponds to the case of GaAs) it is found that $E_1$=0.197 meV and $E_2$=0.788 meV. The electron waveguide supports a single mode in the energy range between $E_1$ and $E_2$. In the case where the quantum dot has dimensions L×L where L=176 nm, the energy of the two lowest electron states in the quantum dot can be approximated by:

$$E_1^* = \frac{\hbar^2}{2m^*} \cdot \left[\left(\frac{\pi}{L}\right)^2 + \left(\frac{\pi}{L}\right)^2\right] = 0.370 \text{ meV} \quad (3)$$

$$E_1^* = \frac{\hbar^2}{2m^*} \cdot \left[\left(\frac{\pi}{L}\right)^2 + \left(\frac{2\pi}{L}\right)^2\right] = 0.924 \text{ meV} \quad (4)$$

The conductance between the input port 306 and the output port 308 is plotted in FIGS. 3B–3D for energies in the vicinity of $E_1^*$. The conductance is given in units of 7.75 e-5Ω$^{-1}$. The curve has a Lorentzian lineshape centered around $E_1^*$. From Eq. (3), it is seen that the center energy of the Lorentzian can be shifted simply by changing the dimensions of the quantum dot. This can be achieved, for example, by changing the applied potential on the metal contact 304. By reducing the applied potential, the electronic wavefunction becomes less localized inside the dot, which leads to an increase of L and a reduction of $E_1^*$. The linewidth of the Lorenztian depends on the lifetime of the localized state inside the dot, which in turn depends on the coupling strength between the guided state inside the wire and the localized state inside the dot. The coupling strength can be changed by changing the applied voltage on the metal contacts 302 or 304, or by positioning the dot closer or farther from the quantum wire.

The structure shown in FIG. 2A has a mirror plane perpendicular to the wire, and a resonant state which has even symmetry with respect to that plane. The wavefunction that decays along the input port 206 has the same phase as the one which decays along the output port 208. However, in the case where the coupling element 102 in FIG. 1 has a resonant state with odd symmetry with respect to the mirror plane, the decaying wavefunction along the input port 106 and the output port 108 are 180 degrees out of phase.

In the case where there are more than one resonant state inside the coupling element 102 shown in FIG. 1, each state decays along both the input port 106 and the output port 108. The transmitted wavefunction at the output port is composed of the input wavefunction and a sum of all the decaying wavefunctions from the coupling element. The reflected signal at the input port, on the other hand, is composed of only the decaying wavefunctions in the backward direction.

By properly choosing the coupling element, it is possible for the decaying wavefunctions in the backward direction to interfere destructively and cancel each other, resulting in zero back reflection. The transport efficiency between the input port and the output port is thus equal to 100% for every electronic energy. However, at resonance, the wavefunction has a different phase. By varying the voltage on the contacts, the resonant energy of the coupling element can be changed, which in turn modulates the phase of the transmitted wave. In this regime, the electronic transporter behaves as a phase modulator.

Before describing a specific embodiment for the phase modulator, it is necessary to determine the conditions for which the decaying wavefunctions in the backward direction interfere destructively. Assume that the structure shown in FIG. 1 has a mirror plane perpendicular to the waveguides, and that the coupling element supports two electronic resonant states, one even, labeled |even>, and one odd, labeled |odd>, with respect to the mirror plane. The incoming wave exp(ikx) can then be decomposed into the form cos(kx)+i sin(kx), where x corresponds to the direction along the electronic waveguide. The cos(kx) part, which is even with respect to the mirror plane, couples only to the even resonant state. The sin(kx) part, on the other hand, is odd, and couples only to the odd resonant state. In the specific case where both the coupling constants and the resonant energy are equal for both states, a resonant state of the form |even>+i |odd>is excited, which in turn decays only along the forward direction. As a result, reflection in the backward direction at the input port is completely absent.

Figure 4A:
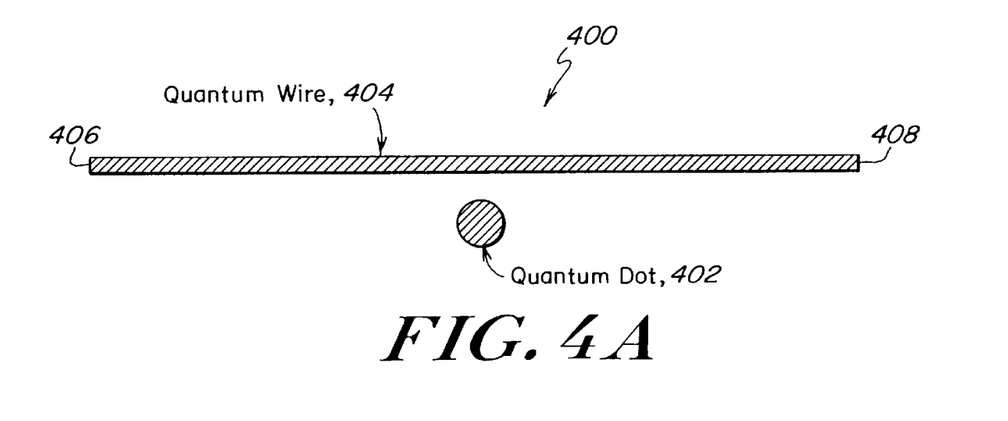
FIG. 4A is a simplified schematic diagram of an electronic transporter using a single quantum wire and a large quantum dot.
Figure 4B:
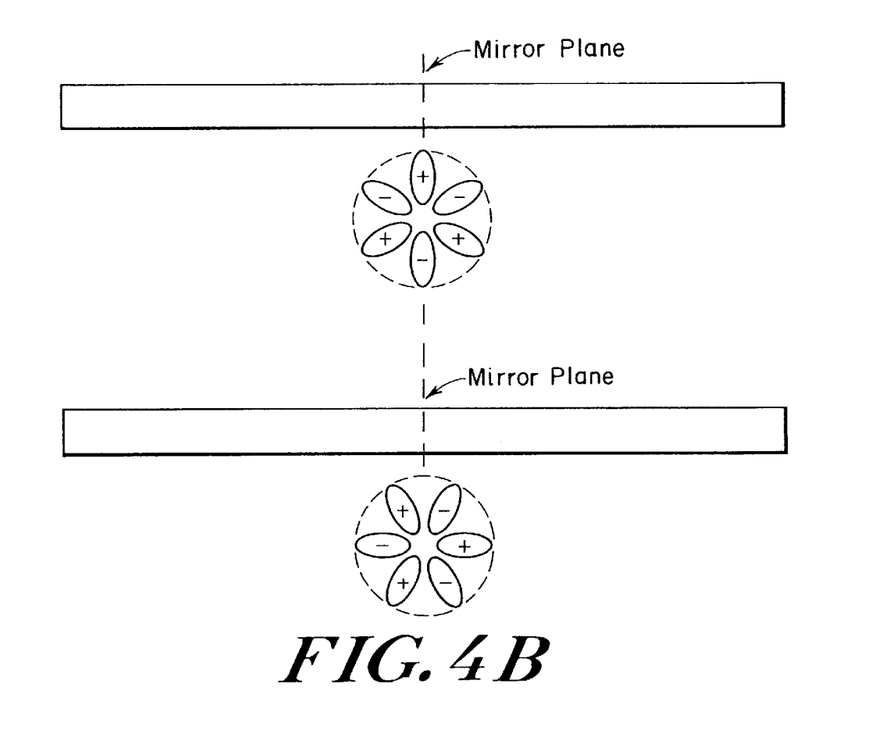
FIG. 4B is a contour plot of the amplitude of electronic wavefunction in the quantum dot.

FIG. 4A is a simplified schematic diagram of an electronic transporter 400 in accordance with the invention. The transportor 400 includes a large quantum dot 402 and a single quantum wire 404 with an input port 406 and an output port 408. The quantum dot 402 is configured to support two doubly-degenerate electronic states, i.e., two states with the same energy. This is accomplished by making the dot bigger than the one shown in FIG. 2A. The field pattern of the two states is shown in FIG. 4B. FIG. 4B is a contour plot of the amplitude of electronic wavefunction in the quantum dot. The + and − signs indicate the sign of the amplitude. One of these states is even and the other odd with respect to the mirror plane. Since the two states couple differently to the quantum wire (i.e., they may have different linewidths and resonant energies), complete cancellation in the backward direction is guaranteed by changing the shape of the quantum dot slightly, such as making the dot slightly elliptical.

Figure 5A:
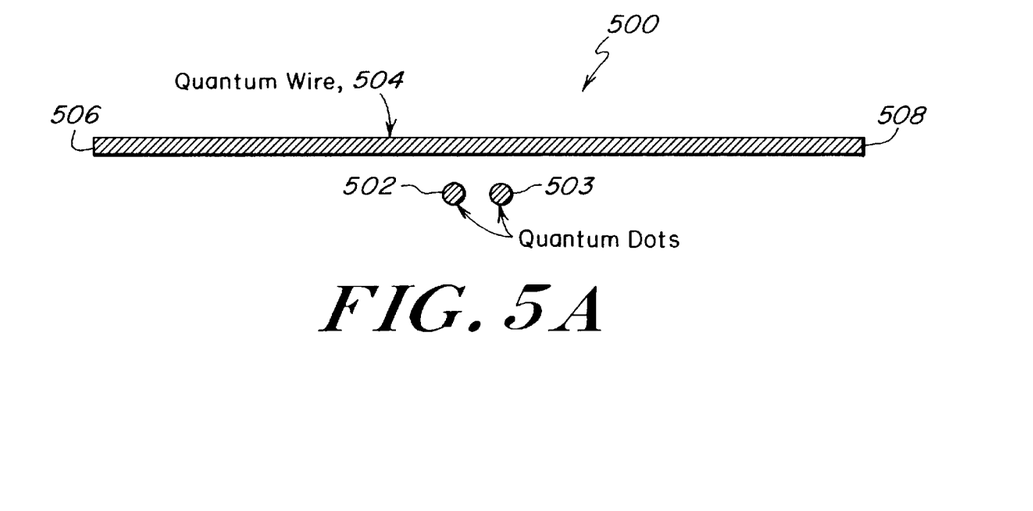
FIG. 5A is a simplified schematic diagram of an electronic transporter using a single quantum wire and two quantum dots.
Figure 5B:
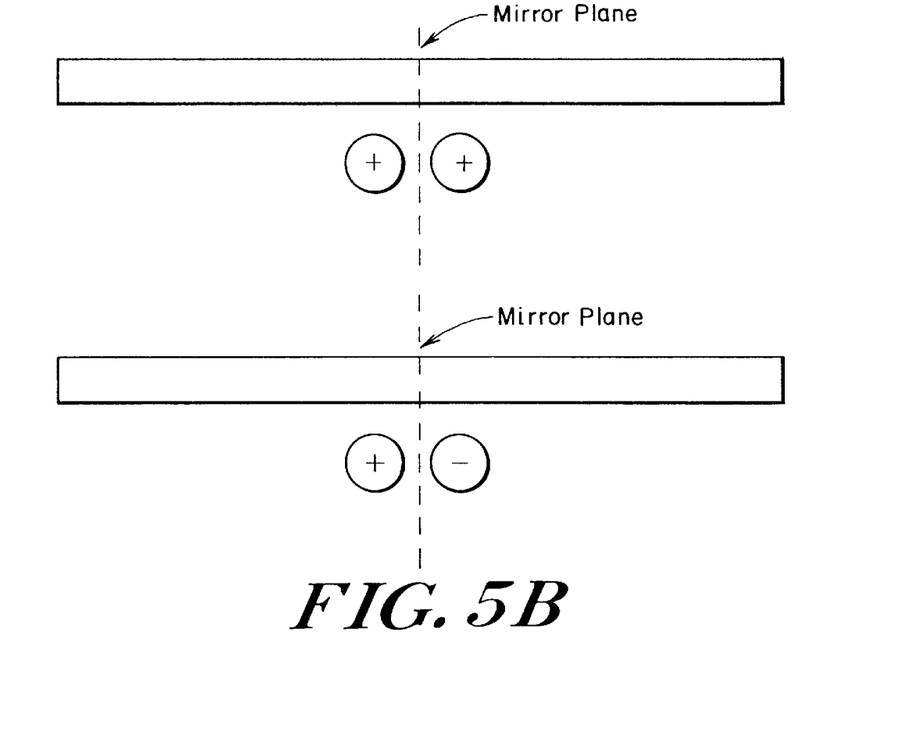
FIG. 5B is a contour plot of the field pattern in the quantum dots.

In an alternative embodiment, it would have been possible also to use two dots with single states instead of a single dot with doubly-degenerate states. This arrangement is shown in FIG. 5A. FIG. 5A is a simplified schematic diagram of an electronic transportor 500 in accordance with the invention. The transporter 500 includes a single quantum wire 504, with an input port 506 and an output port 508, and two quantum dots 502, 503. FIG. 5B is a contour plot of the field pattern in the quantum dots. The + and − signs indicate the sign of the field. The even (odd) state is composed of an even (odd) linear combination of the two single states. The two states are coupled with each other through direct electronic tunneling between the two dots, and are also coupled indirectly via the quantum wire. Each coupling mechanism splits the energy (i.e., breaks the degeneracy) of the even and odd states, but with an opposite sign. The exact cancellation between the two coupling mechanisms can be ensured, for example, by changing the applied voltage, or by changing the position of the dots, or their shapes.

Figure 6:
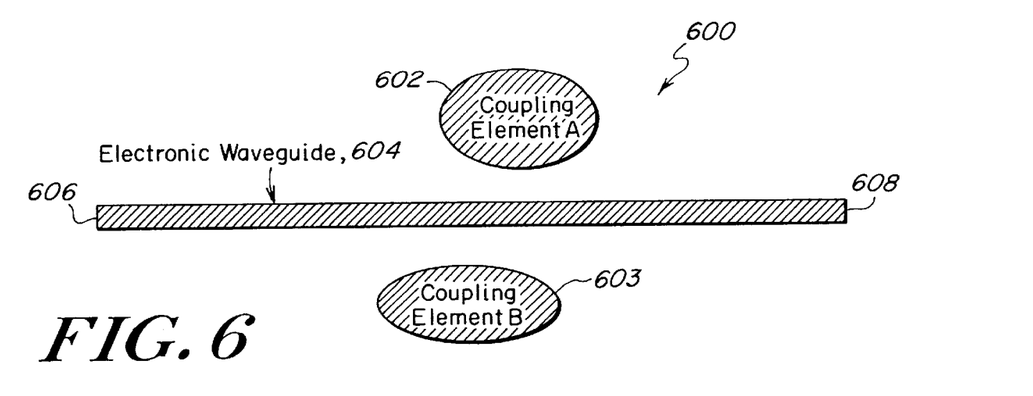
FIG. 6 is a simplified schematic diagram of a 2-port electronic transportor using two coupling elements.

In another alternative embodiment, the transportor can have coupling elements on either side of the electronic waveguide, as shown in FIG. 6. FIG. 6 is a simplified schematic diagram of a 2-port electronic transporter 600. The transporter 600 includes two coupling elements 602, 603, and an electronic waveguide 604 with an input port 606 and an output port 608. The two coupling elements need not be identical, nor do they need to be symmetric with respect to the vertical plane passing through the middle of the waveguide.

Figure 7A:
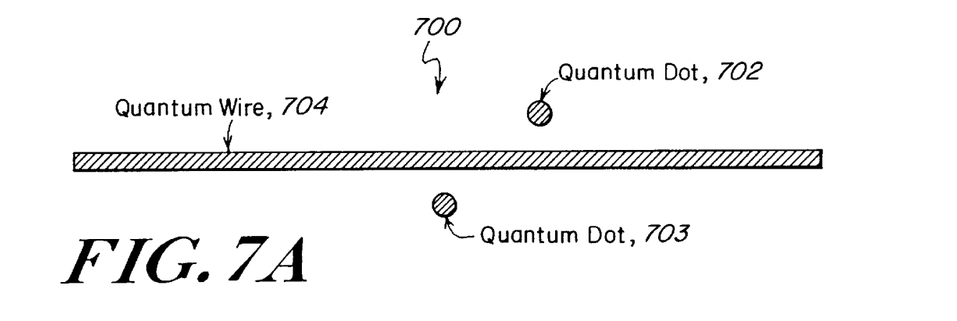
FIGS. 7A and 7B are simplified schematic diagrams of an electronic transportor using a single quantum wire and two quantum dots positioned on either side of the wire, where the dots are offset from each other, and the dots are directly opposite each other, respectively.

In another alternative embodiment, the coupling elements are chosen to be two quantum dots positioned on either side of the wire, offset from each other along a waveguide. FIG. 7A is a simplified schematic diagram of an electronic transportor 700 using a single quantum wire 704 and two quantum dots 702, 703 positioned on either side of the wire. In this embodiment, the dots are offset from each other. The position and shape of the dots are chosen such that the decaying wavefunctions along the backward direction cancel. The transportor 700 has the same properties as the transportor 500 shown in FIG. 5A.

Figure 7B:
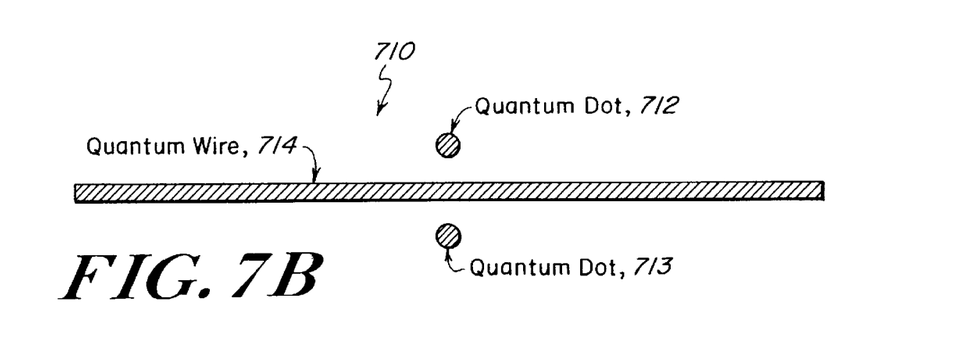

In yet another alternative embodiment of the case of multiple coupling elements is shown in FIG. 7B. FIG. 7B is a simplified schematic diagram of an electronic transporter 710 using a single quantum wire 714 and two quantum dots 712, 713 positioned on either side of the wire. In this embodiment, the two quantum dots are positioned directly opposite from one another across the waveguide. The properties are identical to those of the transportor 200 shown in FIG. 2A.

Figure 8:
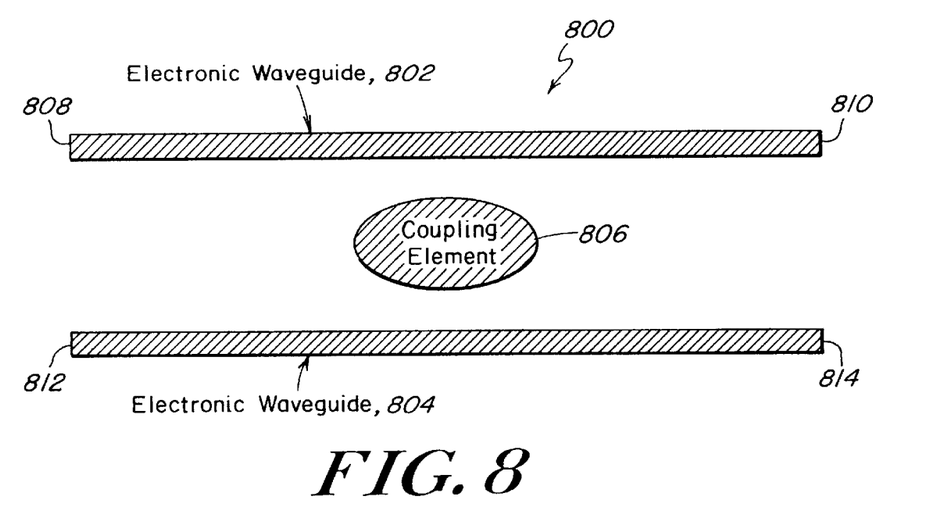
FIG. 8 is a simplified schematic diagram of a 4-port electronic transporter.

Illustrated embodiments of the invention for the second type of device, electronic transporters with four ports, are now described. FIG. 8 is a simplified schematic diagram of an electronic transporter 800 in accordance with the invention. The transporter 800 includes two electron waveguides 802, 804, which are coupled through a resonant coupling element 806. The first waveguide 802 includes an input port 808 and an output port 810. The second waveguide 804 includes an input port 812 and an output port 814. The two waveguides are positioned far enough from each other to prevent any electrons from tunneling between the two guides, except via the coupling element.

Electrons are injected into the transporter 800 device at the input port 808. At resonance, the electronic wavefunction in the first waveguide 802 excites the resonant states inside the coupling element 806. The resonant states are free to decay into both of the waveguides. The wavefunction at the output port 810 is composed of two parts, the input wavefunction and the signal which originates from the decay of the electronic wavefunctions in the coupling element. By properly choosing the coupling element, it is possible for these two parts to interfere destructively, resulting in zero transport efficiency at the output port 810. The reflected signal at the input port 808 originates entirely from the decay of the resonant states. In order for the resonant states to cancel at the input port 808, it is necessary to have a coupling element which supports states of opposite symmetry with respect to a mirror plane perpendicular to the waveguides. The resonant states decay also into the output ports 812 and 814. In the embodiments described hereinafter, it will be shown how the transport efficiency can be made as large as 100% along either of these two ports at the resonant energy.

Figure 9:
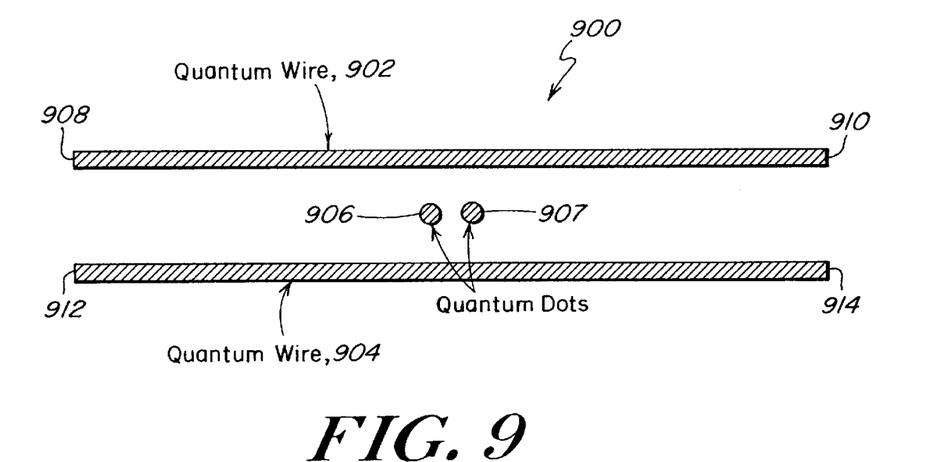
FIG. 9 is a simplified schematic diagram of an electronic transportor using two quantum wires and two quantum dots.

A simplified schematic diagram of an exemplary embodiment of a 4-port transportor 900 in accordance with the invention is shown in FIG. 9. The transporter 900 includes two quantum wires 902, 904 serving as waveguides, and two quantum dots 906, 907 serving as a coupling element. Each quantum dot supports a singly-degenerate electronic state. The even (odd) state is composed of an even (odd) linear combination of the two monopoles, as was shown in FIG. 5B. The monopoles are coupled with each other through direct electronic tunneling between the two dots, and are also coupled indirectly via the quantum wires. Each coupling mechanism splits the energy of the even and odd states, but with an opposite sign. The exact cancellation between the two coupling mechanisms can be ensured, for example, by changing the applied voltage, or by changing the position of the dots, or their shapes.

Figure 10A:
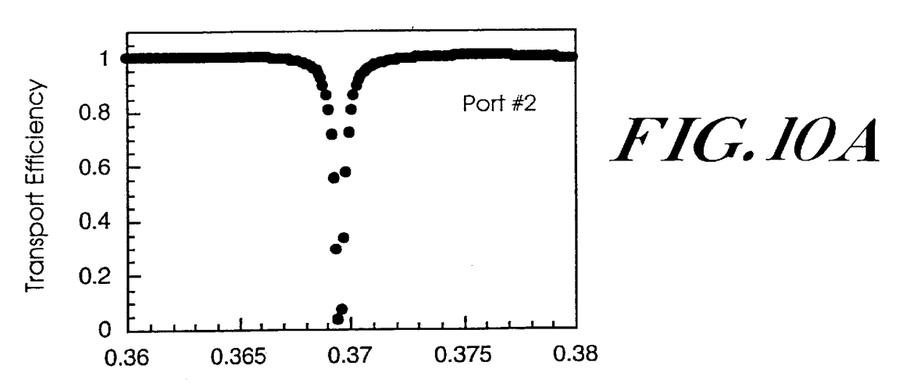
FIGS. 10A–10C are graphs plotting the transport efficiency vs. electronic energy between various ports of the waveguides of FIG. 9.
Figure 10B:
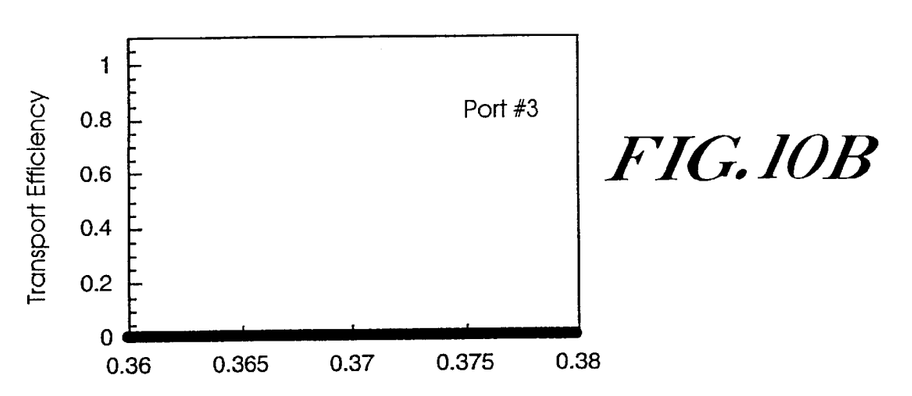
Figure 10C:
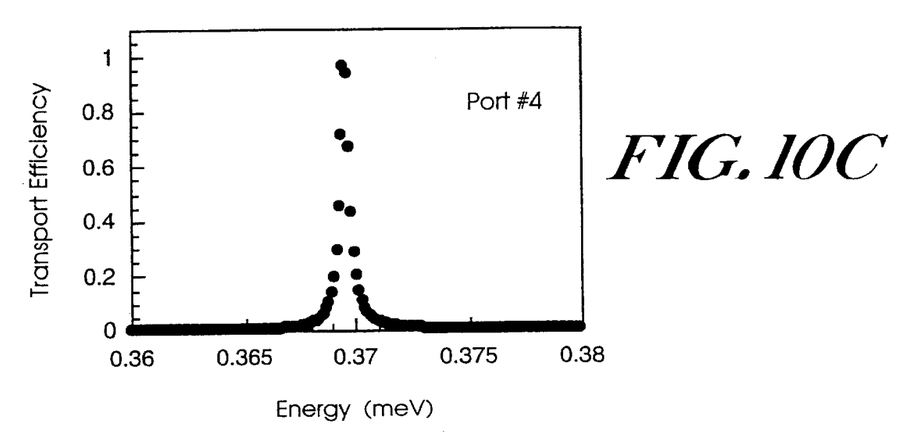

The transport efficiency vs. electronic energy between the different ports of transporter 900 is plotted in the graphs of FIGS. 10A–10C. The transport efficiency between the input port 908 and the output port 910 is seen in FIG. 10A to be 100% for every electronic energy except at energies close to resonance. At exactly the resonant energy, the efficiency is 0%. The transport efficiency between the input port 908 and the input port 912 is shown in FIG. 10B to be 0% for every electron energy in the range of interest. Finally, the transport efficiency between the input port 908 and the output port 914 is shown in FIG. 10C to be 0% everywhere except at resonance, in which case it is 100%. The structure thus behaves as a channel drop filter.

Figure 11A:
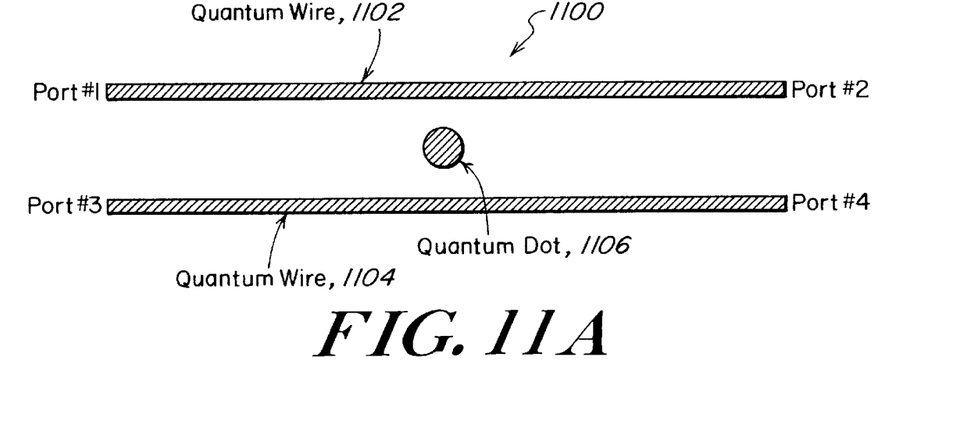
FIG. 11A is a simplified schematic diagram of an electronic transporter using two quantum wires and a single quantum dot.
Figure 11B:
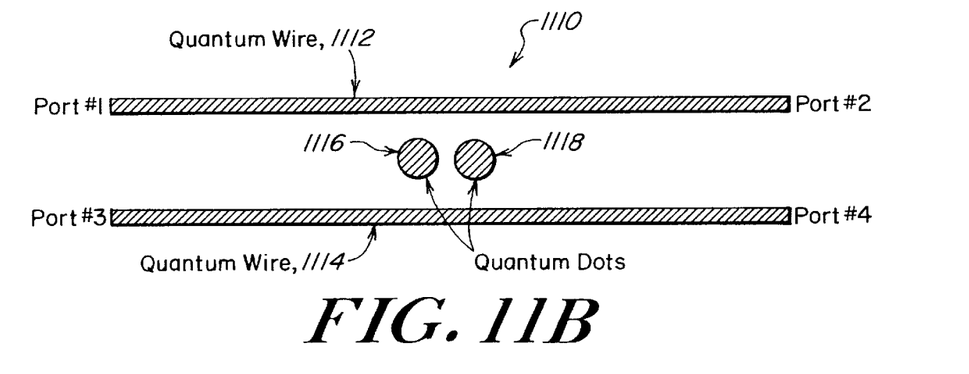
FIG. 11B is a simplified schematic diagram of an electronic transportor using two quantum wires and two quantum dots.
Figure 11C:
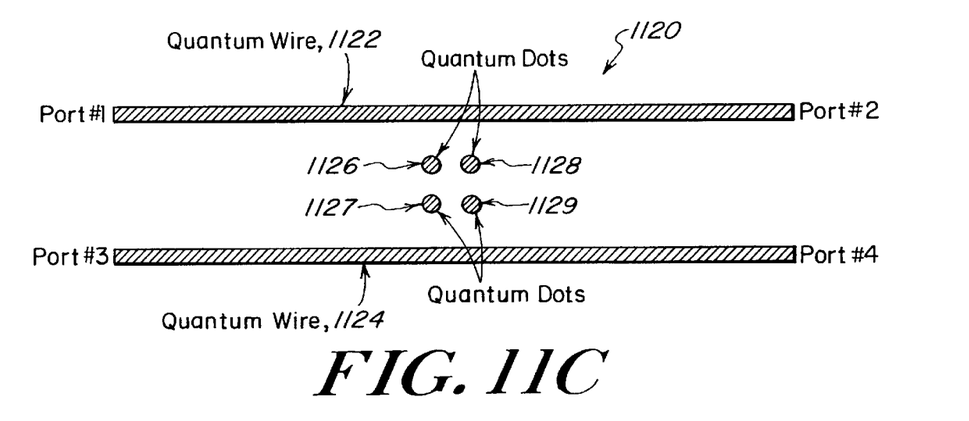
FIG. 11C is a simplified schematic diagram of an electronic transportor using two quantum wires and four quantum dots.

Further alternative embodiments of 4-port devices are shown in the simplified schematic diagrams of FIGS. 11A–11C. In these cases, 100% transport efficiency can be achieved at resonance at either output port of the second waveguide. FIG. 11A shows an electronic transportor 1100 using two quantum wires 1102, 1104 and a single large quantum dot 1106. FIG. 11B shows an electronic transporter 1110 using two quantum wires 1112, 1114 and two large quantum dots 1116, 1118. FIG. 11C shows an electronic transporter 1120 using two quantum wires 1122, 1124 and four small quantum dots 1126, 1127, 1128, 1129.

Although the present invention has been shown and described with respect to several preferred embodiments thereof, various changes, omissions and additions to the form and detail thereof, may be made therein, without departing from the spirit and scope of the invention.

What is claimed is:

1. An electronic device comprising:
    an electronic waveguide for propagating electrons of a plurality of energies therethrough; and
    an electronic resonator system which is laterally coupled to said waveguide by resonant tunneling such that said electronic resonator system is not within said electronic waveguide.

2. The device of claim 1, wherein said electronic waveguide comprises a quantum wire.

3. The device of claim 1, wherein said electronic waveguide comprises a line defect in a solid.

4. The device of claim 1, wherein said resonator system comprises at least one coupling element.

5. The device of claim 4, wherein said coupling element comprises a quantum dot.

6. The device of claim 4, wherein said coupling element comprises a point defect in a solid.

7. The device of claim 1, wherein said device operates as a reflector.

8. The device of claim 1, wherein said device operates as a filter.

9. The device of claim 1, wherein said device operates as a phase modulator.

10. An electronic transportor device comprising:
    an electronic waveguide having an input port and an output port for propagating electrons of a plurality of energies therethrough; and
    an electronic resonator system which is laterally coupled to said waveguide by resonant tunneling such that said electronic resonator system is not within said electronic waveguide, said resonator system reflecting electrons of a first predetermined set of energies and transmitting electrons of the remaining energies through said input waveguide.

11. The device of claim 10, wherein said electronic waveguide comprises a quantum wire.

12. The device of claim 10, wherein said electronic waveguide comprises a line defect in a solid.

13. The device of claim 10, wherein said resonator system comprises at least one coupling element.

14. The device of claim 13, wherein said coupling element comprises a quantum dot.

15. The device of claim 13, wherein said coupling element comprises a point defect in a solid.

16. The device of claim 13, wherein said electronic resonator system comprises a plurality of coupling elements arranged on the same side of said waveguide.

17. The device of claim 13, wherein said electronic resonator system comprises at least one coupling element on one side of said waveguide and at least one coupling element on the opposite side of said waveguide.

18. The device of claim 10, wherein said device operates as a reflector.

19. The device of claim 10, wherein said device operates as a filter.

20. An electronic transporter device comprising:
    an electronic waveguide having an input port and an output port for propagating electrons of a plurality of energies therethrough; and
    an electronic resonator system which is laterally coupled to said waveguide by resonant tunneling such that said electronic resonator system is not within said electronic waveguide, said resonator system transmitting all electron energies through said input waveguide and modulating the phase of the transmitted electrons.

21. The device of claim 20, wherein said electronic waveguide comprises a quantum wire.

22. The device of claim 20, wherein said electronic waveguide comprises a line defect in a solid.

23. The device of claim 20, wherein said resonator system comprises at least one coupling element.

24. The device of claim 23, wherein said coupling element comprises a quantum dot.

25. The device of claim 23, wherein said coupling element comprises a point defect in a solid.

26. The device of claim 23, wherein said electronic resonator system comprises a plurality of coupling elements arranged on the same side of said waveguide.

27. The device of claim 23, wherein said electronic resonator system comprises at least one coupling element on one side of said waveguide and at least one coupling element on the opposite side of said waveguide.

28. An electronic transporter device comprising:
    an input electronic waveguide which propagates electrons of a plurality of energies including a desired energy;
    an output electronic waveguide; and
    an electronic resonator system coupled between said input and output waveguides such that said electronic resonator system is not within said electronic waveguides, and which transfers electrons of said desired energy to said output waveguide and allows transmission of electrons of the remaining energies through said input waveguide.

29. The device of claim 28, wherein said electronic waveguides comprises quantum wires.

30. The device of claim 28, wherein said electronic waveguide comprises a line defect in a solid.

31. The device of claim 28, wherein said resonator system comprises at least one coupling element.

32. The device of claim 31, wherein said coupling element comprises a quantum dot.

33. The device of claim 31, wherein said coupling element comprises a point defect in a solid.

34. The device of claim 28, wherein said device operates as a channel drop filter.

* * * * *